United States Patent
Lin

(10) Patent No.: US 8,513,979 B2
(45) Date of Patent: Aug. 20, 2013

(54) INTEGRATED CIRCUIT AND RELATED CONTROLLING METHOD

(75) Inventor: Chung-Chang Lin, Hsinchu County (TW)

(73) Assignee: Realtek Semiconductor Corp., Hsinchu (TW)

( * ) Notice: Subject to any disclaimer, the term of this patent is extended or adjusted under 35 U.S.C. 154(b) by 9 days.

(21) Appl. No.: 13/308,478

(22) Filed: Nov. 30, 2011

(65) Prior Publication Data

US 2012/0139605 A1 Jun. 7, 2012

(30) Foreign Application Priority Data

Dec. 2, 2010 (TW) ............................... 99141894 A

(51) Int. Cl.
*G01R 19/00* (2006.01)
(52) U.S. Cl.
USPC ............................................. 327/18; 327/64
(58) Field of Classification Search
USPC .................... 327/63, 64, 94, 18, 20
See application file for complete search history.

(56) References Cited

U.S. PATENT DOCUMENTS

| | | | |
|---|---|---|---|
| 5,500,611 A * | 3/1996 | Popat et al. | 326/87 |
| 6,028,474 A * | 2/2000 | Ito | 327/544 |
| 6,448,812 B1 * | 9/2002 | Bacigalupo | 326/83 |
| 7,036,055 B2 * | 4/2006 | Muljono et al. | 714/716 |
| 7,231,566 B2 * | 6/2007 | Whetsel | 714/726 |
| 7,583,104 B2 * | 9/2009 | Simmons et al. | 326/82 |
| 7,657,660 B2 * | 2/2010 | Taniguchi et al. | 710/2 |
| 8,214,706 B2 * | 7/2012 | Urabe et al. | 714/736 |
| 8,327,173 B2 * | 12/2012 | Hendin et al. | 713/323 |
| 2001/0041967 A1 * | 11/2001 | Nakayama | 702/117 |
| 2004/0139376 A1 * | 7/2004 | Ohta et al. | 714/724 |
| 2008/0094918 A1 * | 4/2008 | Fujizoe | 365/189.07 |
| 2012/0257655 A1 * | 10/2012 | Muth | 375/219 |

* cited by examiner

*Primary Examiner* — Thomas J Hiltunen
(74) *Attorney, Agent, or Firm* — McClure, Qualey & Rodack, LLP

(57) ABSTRACT

An integrated circuit includes: a circuit pin; a detecting circuit coupled to the circuit pin, and arranged to detect a signal level value of the circuit pin when the integrated circuit operates in a first operational mode; a storage circuit coupled to the detecting circuit, and arranged to store the signal level value; and a controlling circuit coupled to the storage circuit, and arranged to set a voltage level of the circuit pin according the signal level value when a processing circuit of the integrated circuit operates in a second operational mode.

18 Claims, 4 Drawing Sheets

US 8,513,979 B2

INTEGRATED CIRCUIT AND RELATED CONTROLLING METHOD

BACKGROUND OF THE INVENTION

1. Field of the Invention

The present invention relates to an integrated circuit and related controlling method, and more particularly to prevention of leakage current in an integrated circuit and the related method.

2. Description of the Prior Art

When an integrated circuit is implemented and installed in a circuit board, the plurality of output pins of the integrated circuit are connected to the plurality of input pins of another integrated circuit. Furthermore, the output pins of the integrated circuit can also be utilized to receive a set of predetermined bit values for initializing the integrated circuit when the circuit system on the circuit board is powered up. Practically, the output pins of the integrated circuit are connected to a plurality of resistors in parallel, respectively. For example, when the circuit system is powered up, and if the bit value arranged for an output pin is 1, then the corresponding resistor is controlled to couple between the output pin and a supply voltage. On the other hand, if the bit value arranged for an output pin is 0, then the corresponding resistor is controlled to couple between the output pin and a ground voltage. Accordingly, the plurality of output pins of the integrated circuit is able to receive a set of predetermined bit values for initializing the integrated circuit when the circuit system is powered up. Then, after the circuit system is powered up, the output pins of the integrated circuit are returned to their original functions, i.e., outputting the signals generated by the integrated circuit. However, the above-mentioned resistors may still connect to the output pins respectively when the circuit system operates in the normal operational mode. Then, if an output voltage level at one output pin is opposite to the voltage level of the predetermined bit value when the circuit system is powered up, the resistor connected to the output pin may induce a current when the circuit system operates in the normal operational mode. More specifically, if the predetermined bit value of one output pin is 0 (i.e., a resistor is controlled to couple between the output pin and the ground voltage), then a leakage current will be induced to flow from the high voltage level to the ground voltage via the resistor when the idle voltage level of the output pin is the high voltage level. Therefore, the conventional output pin of the circuit system may induce a leakage current when the output pin is in the idle mode or the normal operational mode.

SUMMARY OF THE INVENTION

The objective of the present invention is to therefore provide an integrated circuit capable of preventing a leakage current and the related method.

According to a first embodiment of the present invention, an integrated circuit is disclosed. The integrated circuit comprises a circuit pin, a detecting circuit, a storage circuit, and a controlling circuit. The detecting circuit is coupled to the circuit pin, and arranged to detect a signal level value of the circuit pin when the integrated circuit operates in a first operational mode. The storage circuit is coupled to the detecting circuit, and arranged to store the signal level value. The controlling circuit is coupled to the storage circuit, and arranged to set a voltage level of the circuit pin according the signal level value when a processing circuit of the integrated circuit operates in a second operational mode.

According to a second embodiment of the present invention, a method for controlling an integrated circuit is disclosed. The method comprises: detecting a signal level value of a circuit pin when the integrated circuit operates in a first operational mode; storing the signal level value; and setting a voltage level of the circuit pin according to the signal level value when a processing circuit of the integrated circuit operates in a second operational mode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
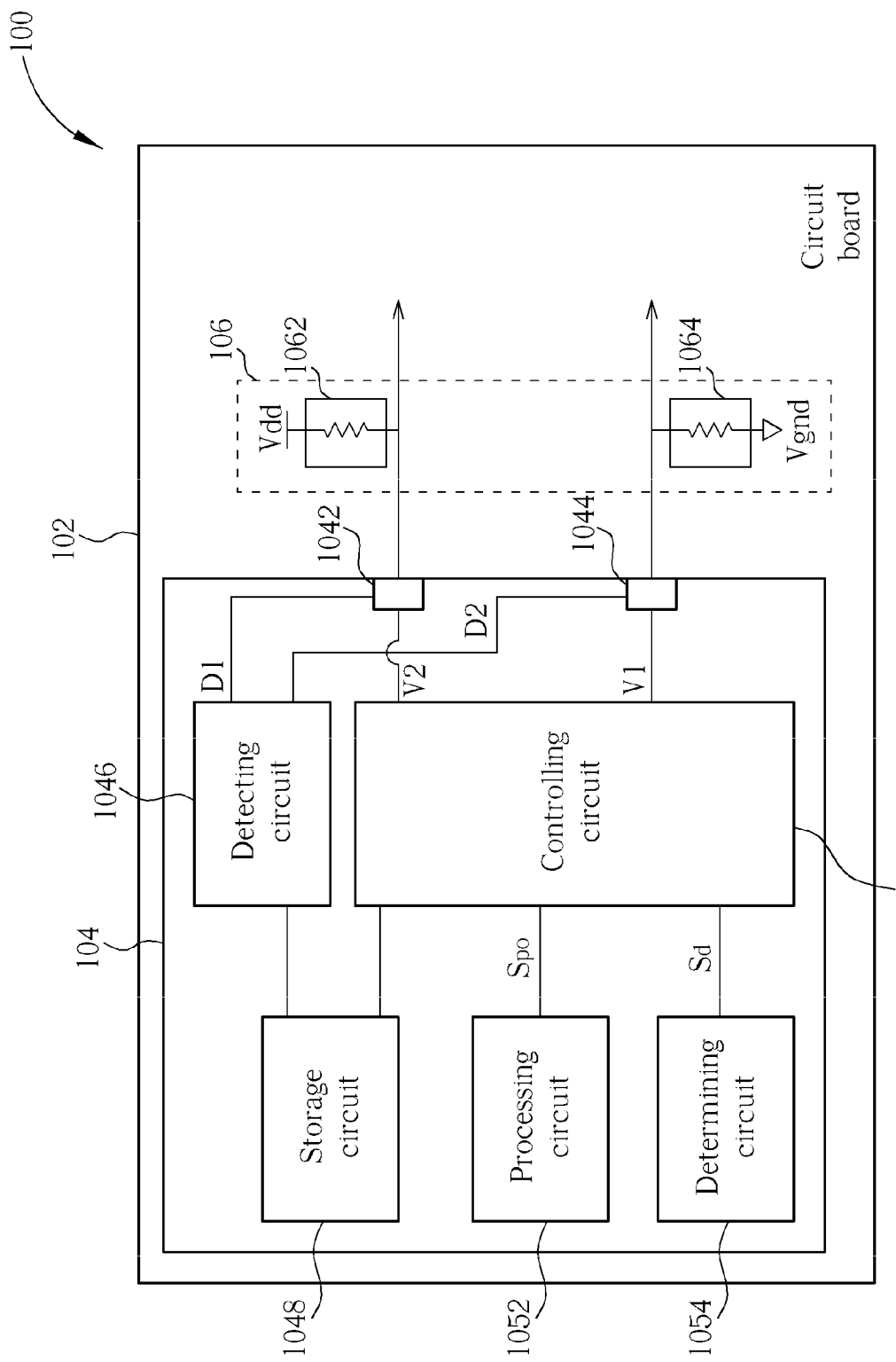
FIG. 1 is a diagram illustrating a circuit system according to an embodiment of the present invention.

Please refer to FIG. 1. FIG. 1 is a diagram illustrating a circuit system 100 according to an embodiment of the present invention. The circuit system 100 is installed on a circuit board 102, the circuit system 100 comprises an integrated circuit 104 and an initial value setting circuit 106. The integrated circuit 104 comprises at least one circuit pin (such as the first circuit pin 1042 and the circuit pin 1044 of this exemplary embodiment) respectively coupled to an input pin of another integrated circuit on the circuit board 102, a detecting circuit 1046, a storage circuit 1048, a controlling circuit 1050, a processing circuit 1052, and a determining circuit 1054. The initial value setting circuit 106 comprises a first resistor 1062 and a second resistor 1064. The circuit pins 1042, 1044 are employed to output the signals generated by the processing circuit 1052 to the following circuit stage when the circuit system 100 operates in a normal operational mode.

When the circuit system 100 is enabled or powered up, the predetermined first signal level value D1 (i.e., the high voltage level) and the second signal level D2 (i.e., the low voltage level) received by the integrated circuit 104 at the first circuit pin 1042 and the second circuit 1044 respectively can be utilized to initialize the integrated circuit 104. In other words, the first resistor 1062 is coupled between the first circuit pin 1042 and a power voltage Vdd, the second resistor 1064 is coupled between the second circuit pin 1044 and a ground voltage Vdd. The detecting circuit 1046 is coupled to the first circuit pin 1042 and the second circuit pin 1044, and is utilized to detect the signal level value D1 and the second signal level value D2 of the first circuit pin 1042 and the second circuit pin 1044 respectively when the integrated circuit 104 operates in a first operational mode (i.e. when the integrated circuit 104 is enabled).

The storage circuit 1048 is coupled to the detecting circuit 1046 for storing the first signal level value D1 and the second signal level value D2. The controlling circuit 1050 is coupled to the storage circuit 1048, and is utilized to set a first voltage level V1 and a second voltage level V2 of the circuit pin 1042 and the second circuit pin 1044 according to the first signal level value D1 and the second signal level value D2 respectively when the processing circuit 1052 of the integrated circuit 104 operates in a second operational mode (i.e. when the processing circuit 1052 of the integrated circuit 104 is idle). The determining circuit 1054 is utilized to determine if the processing circuit 1052 of the integrated circuit 104 enters the second operational mode and generate a determining signal Sd, wherein when the processing circuit 1052 enters the second operational mode, the controlling circuit 1050 sets the voltage level V1 and the second voltage level V2 of the first circuit pin 1042 and the second circuit pin 1044 as the first signal level value D1 and the second signal level value D2 respectively according to the determining signal Sd. In this exemplary embodiment, the first signal level value D1 corresponds to the level of the power voltage Vdd, the second signal level value D2 corresponds to the level of the ground voltage Vdd, but this is not a limitation of the present invention. Furthermore, the processing circuit 1052 is arranged to generate a pre-output signal Spo when the integrated circuit 104 operates in a third operational mode (i.e., the normal operational mode).

Figure 2:
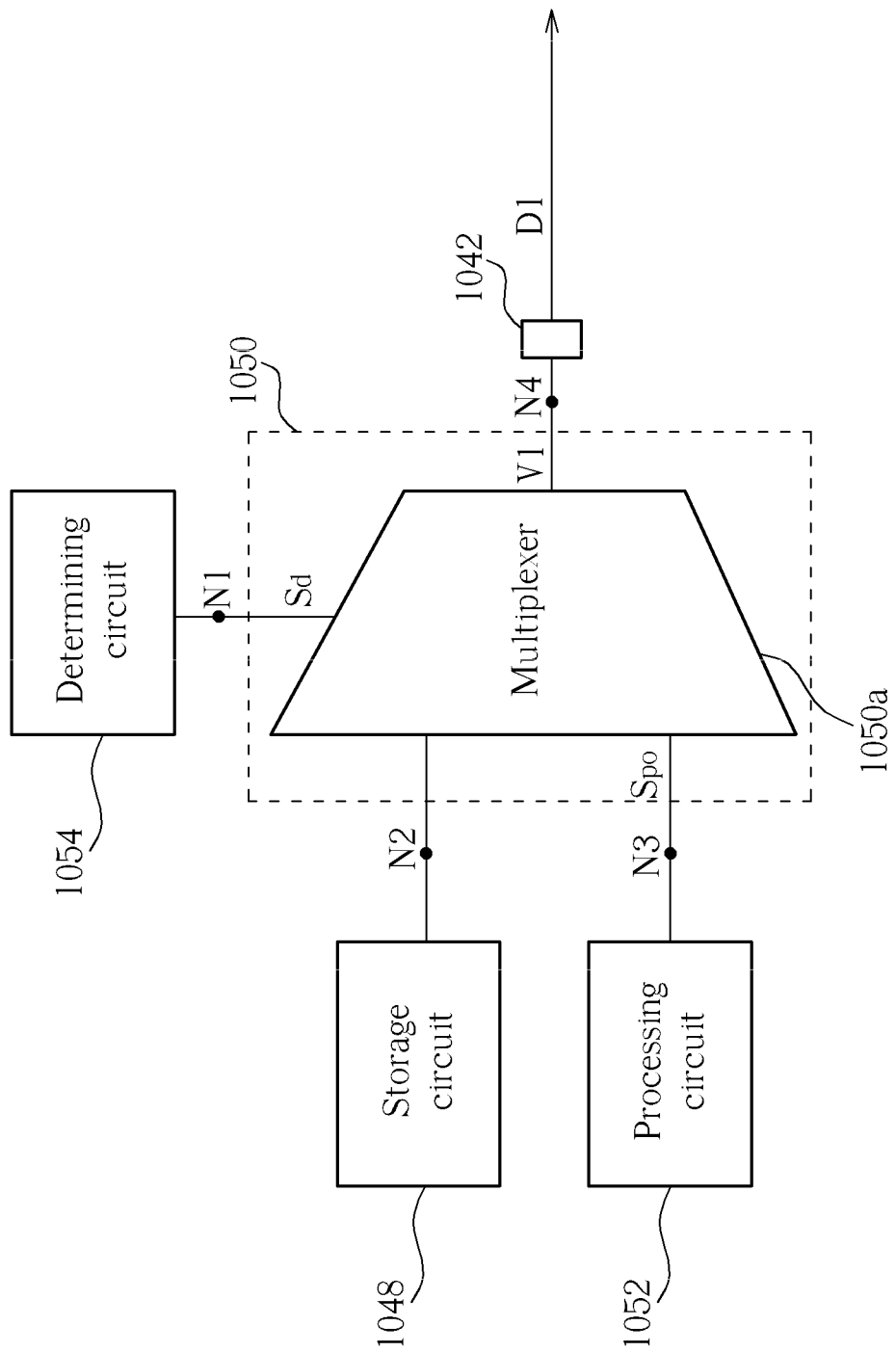
FIG. 2 is a diagram illustrating a partial integrated circuit shown in FIG. 1 according to an embodiment of the present invention.

In addition, FIG. 2 is a diagram illustrating a partial integrated circuit 104 shown in FIG. 1 according to an embodiment of the present invention. Please note that, the controlling circuit 1050 in the FIG. 2 is shown for the purpose of describing the controlling of the first circuit pin 1042, thus the second circuit pin 1044 is not shown in FIG. 2. The controlling circuit 1050 comprises a multiplexer 1050a, and the multiplexer 1050a has a controlling terminal N1 coupled to the determining circuit 1054, a first input terminal N2 coupled to the storage circuit 1048, a second input terminal N3 coupled to the processing circuit 1052, and an output terminal N4 coupled to a circuit pin (e.g. the circuit pin 1042). The multiplexer 1050a is arranged to selectively couple the output terminal N4 to the first input terminal N2 or the second input terminal N3 according to the determining signal Sd.

Please refer to FIG. 1 in conjunction with FIG. 2. For the example of the first circuit pin 1042, the first resistor 1062 is coupled between the first circuit pin 1042 and the power voltage Vdd. Then, when the circuit system 100 is enabled or powered up, the power voltage Vdd arises in the first circuit pin 1042 via the first resistor 1062. Therefore, the voltage level of the first signal level value D1 is the high voltage level (e.g. 1). Then, the detecting circuit 1046 detects the first signal level value D1 and stores the first signal level value D1 into the storage circuit 1048. When the circuit system 100 is enabled or when the powering on is done, the integrated circuit 104 enters the normal operational mode. When the integrated circuit 104 operates in the normal operational mode, the processing circuit 1052 generates the pre-output signal Spo to the first circuit pin 1042 for transmitting the pre-output signal Spo to the next circuit stage. It should be noted that, the processing circuit 1052 may not always generate the pre-output signal Spo. In other words, the processing circuit 1052 may operate in the idle mode for some intervals.

Figure 3:
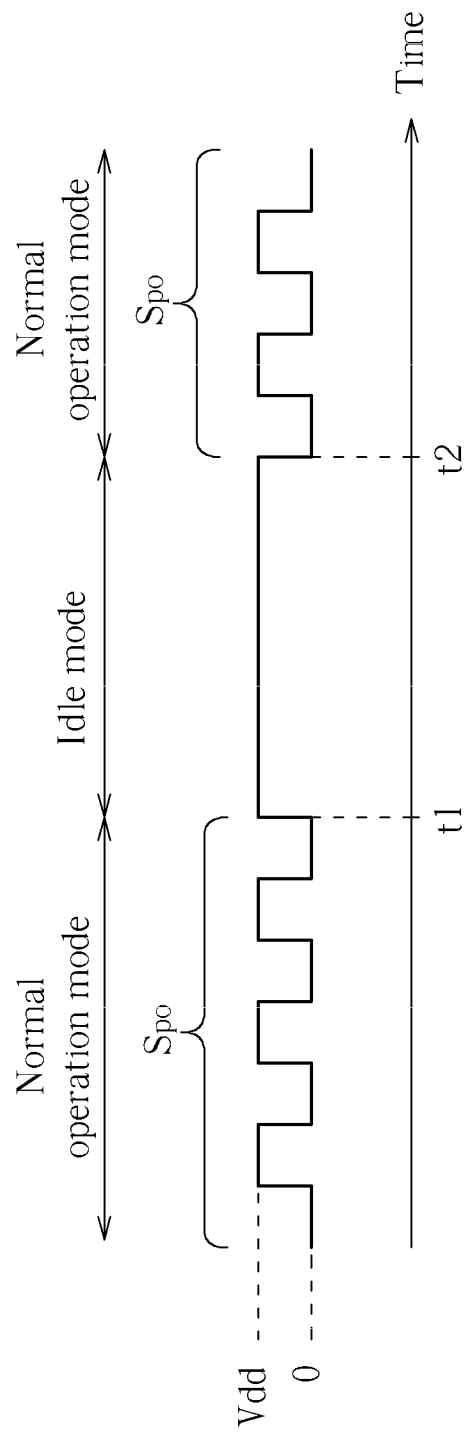
FIG. 3 is a timing diagram illustrating a pre-output signal according to an embodiment of the present invention.

Please refer to FIG. 3. FIG. 3 is a timing diagram illustrating a pre-output signal Spo according to an embodiment of the present invention. In this exemplary embodiment, the processing circuit 1052 generates the pre-output signal Spo before the time t1 and after the time t2, and the processing circuit 1052 operates in the idle mode between the time t1 and the time t2. Please note that, the pre-output signal Spo in this exemplary embodiment is a toggle signal. When the integrated circuit 104 operates in the normal operational mode (i.e. before the time t1 and after the time t2), the determining circuit 1054 generates the determining signal Sd to control the multiplexer 1050a to couple the second input terminal N3 to the output terminal N4, and then to transmit the pre-output signal Spo generated by the processing circuit 1052 to the first circuit pin 1042.

However, when the processing circuit 1052 does not generate the pre-output signal Spo, the voltage at the first circuit pin 1042 should be set as the first voltage level V1 to prevent the leakage current induced by the first resistor 1062. Accordingly, when the determining circuit 1054 determines that the processing circuit 1052 of the integrated circuit 104 is ready to enter or has already entered the idle mode from the normal operational mode, the determining circuit 1054 generates the determining signal Sd to the multiplexer 1050a. Then, the determining signal Sd controls the multiplexer 1050a to couple the first input terminal N2 to the output terminal N4. Accordingly, the voltage level of the output terminal N4 can be set as the first signal level value D1, which is recorded in the storage circuit 1048 by the detecting circuit 1046 when the circuit system 100 is powered up.

Therefore, when the processing circuit 1052 of the integrated circuit 104 operates in the idle mode, the first voltage level V1 at the first circuit pin 1042 is set as the voltage level corresponding to the first signal level value D1. In this exemplary embodiment, the voltage level corresponding to the first signal level value D1 is the power voltage Vdd, and the first resistor 1062 is coupled between the first circuit pin 1042 and the power voltage Vdd, therefore the voltage drop across the first resistor 1062 is substantially equal to zero when the processing circuit 1052 of the integrated circuit 104 operates in the idle mode. Accordingly, the first resistor 1062 coupled to the first circuit pin 1042 will not induce the leakage current in the idle mode (i.e. between the time t1 and the time t2).

In another exemplary embodiment of the present invention, the storage circuit 1048 may be a register, the integrated circuit 104 may further comprises a clock circuit (not shown), which is arranged to generate a clock signal to the storage circuit 1048 or the processing circuit 1052 for controlling the storage circuit 1048 or the processing circuit 1052 respectively. When the processing circuit 1052 is in the idle mode, and when the first voltage level V1 at the first circuit pin 1042 is set as the voltage level corresponding to the first signal level value D1, the clock circuit is also arranged to enter a power down mode to further reduce the power consumption of the integrated circuit 104.

It should be noted that, even though the features of the above embodiment is described in accordance with the first circuit pin 1042, those skilled in this art may easily understand that the features related to the second circuit pin 1044 when the integrated circuit 104 operates in the normal operational mode and the idle mode. More specifically, when the integrated circuit 104 operates in the normal operational mode, the determining signal Sd generated by the determining circuit 1054 can be arranged to control the controlling circuit 1050 to transmit the pre-output signal Spo generated by the processing circuit 1052 to the second circuit pin 1044; and when the processing circuit 1052 of the processing circuit 1052 is in the idle mode, the determining signal Sd generated by the determining circuit 1054 can be arranged to control the controlling circuit 1050 to set the second voltage level V2 at the circuit pin 1044 as the voltage level corresponding to the second signal level value D2, i.e. the ground voltage Vdd. Then, the voltage drop across the second resistor 1064 is substantially equal to zero. In other words, the second resistor 1064 coupled to the second circuit pin 1044 will not induce the leakage current in the idle mode.

Figure 4:
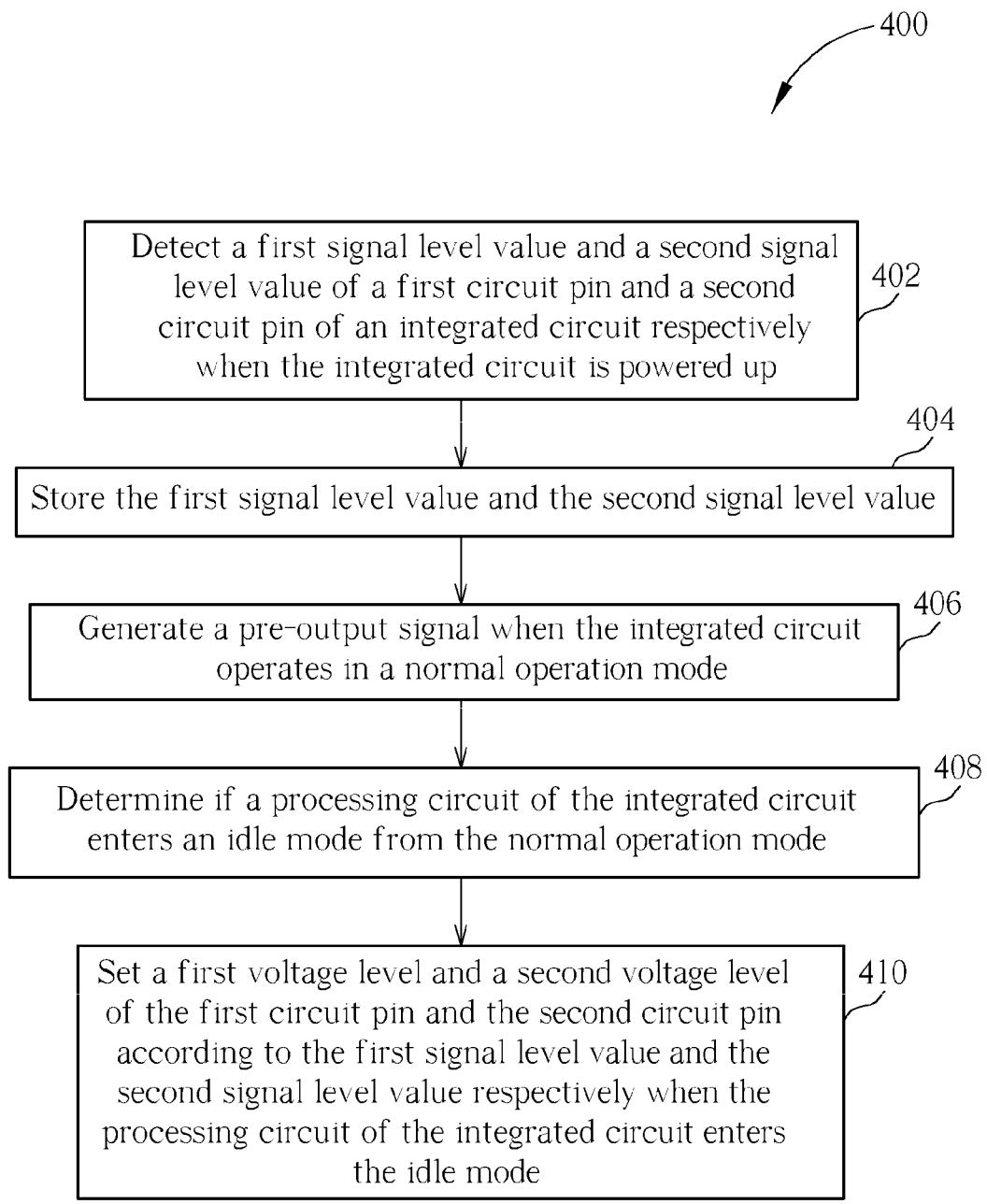
FIG. 4 is a flowchart illustrating a method for controlling an integrated circuit according to an embodiment of the present invention.

In addition, the operation of the integrated circuit 104 of the present invention can be simplified to the steps shown in FIG. 4. FIG. 4 is a flowchart illustrating a method 400 for controlling an integrated circuit according to an embodiment of the present invention. Provided that substantially the same result is achieved, the steps of the flowchart shown in FIG. 4 need not be in the exact order shown and need not be contiguous, that is, other steps can be intermediate. In addition, the features of the method 400 is described in conjunction with the integrated circuit 104 shown in FIG. 1 for brevity, but the integrated circuit 104 is not a limitation of the method 400. The method 400 comprises:

Step 402: Detect the first signal level value D1 and the second signal level value D2 of the first circuit pin 1042 and the second circuit pin 1044 of the integrated circuit 104 respectively when the integrated circuit 104 is powered up;

Step 404: Store the first signal level value D1 and the second signal level value D2;

Step 406: Generate the pre-output signal Spo when the integrated circuit 104 operates in the normal operational mode;

Step 408: Determine if the processing circuit 1052 of the integrated circuit 104 enters the idle mode from the normal operational mode;

Step 410: Set the first voltage level V1 and the second voltage level V2 of the first circuit pin 1042 and the second circuit pin 1044 according to the first signal level value D1 and the second signal level value D2 respectively when the processing circuit 1052 of the integrated circuit 104 enters the idle mode.

According to the above steps 402-410, the first signal level value D1 and the second signal level value D2 are first saved in a storage device. When the integrated circuit 104 operates in the normal operational mode, the first circuit pin 1042 and the second circuit pin 1044 are utilized to output the pre-output signal Spo to the next circuit stage. When the processing circuit 1052 of the integrated circuit 104 is ready to enter or has already entered the idle mode from the normal operational mode, the first signal level value D1 and the second signal level value D2 are arranged to set the first voltage level V1 and the second voltage level V2 of the first circuit pin 1042 and the second circuit pin 1044 respectively to make the voltage drops of the first resistor 1062 and the second resistor 1064 to substantially equal zero. Accordingly, the first resistor 1062 and the second resistor 1064 coupled to the first circuit pin 1042 and the second circuit pin 1044 will not induce the leakage current in the idle mode.

Briefly, according to the present invention, the values of the voltage levels received by the pins of an integrated circuit are arranged to be stored in a storage device when the integrated circuit is powered up, then the values of the voltage levels are arranged to set the voltage levels of the pins to make the voltage drops across the resistors to substantially equal zero. Then, the resistors coupled to the pins of the integrated circuit will not induce the leakage current when the processing circuit is in the idle mode, and therefore the power consumption of the integrated circuit is greatly reduce.

Those skilled in the art will readily observe that numerous modifications and alterations of the device and method may be made while retaining the teachings of the invention.

What is claimed is:

1. An integrated circuit on a circuit board, comprising:
    a circuit pin, coupled to another integrated circuit on the circuit board;
    a detecting circuit, coupled to the circuit pin, for detecting a signal level value of the circuit pin when the integrated circuit operates in a first operational mode;
    a storage circuit, coupled to the detecting circuit, for storing the signal level value;
    a controlling circuit, coupled to the storage circuit, for setting a voltage level of the circuit pin according the detected signal level value when a processing circuit of the integrated circuit operates in a second operational mode; and
    a determining circuit, for determining if the processing circuit enters the second operational mode to generate a determining signal; wherein the controlling circuit sets the voltage level of the signal level value according to the determining signal and the detected signal level value.

2. The integrated circuit of claim 1, wherein the integrated circuit operates in the first operational mode when the integrated circuit is enabled by the circuit pin with a resistor, and operates in the second operational mode when the processing circuit is idle.

3. The integrated circuit of claim 2, wherein the signal level value is a power level value or a ground voltage level value.

4. The integrated circuit of claim 1, wherein: the processing circuit is arranged to generate a pre-output signal when the integrated circuit operates in a third operational mode; and the controlling circuit comprises: a multiplexer, having a controlling terminal coupled to the determining circuit, a first input terminal coupled the storage circuit, a second input terminal coupled to the processing circuit, and an output terminal coupled to the circuit pin, arranged to selectively couple the output terminal to the first input terminal or the second input terminal according to the determining signal.

5. The integrated circuit of claim 1, further comprising: a clock circuit, for providing a clock signal for controlling the storage circuit or the processing circuit; wherein after the controlling circuit sets the voltage level of the circuit pin according to the determining signal and the signal level value, the clock circuit enters a power down mode.

6. A method for controlling an integrated circuit, comprising:
    detecting a signal level value of a circuit pin when the integrated circuit operates in a first operational mode;
    storing the signal level value;
    setting a voltage level of the circuit pin according to the signal level value when a processing circuit of the integrated circuit operates in a second operational mode; and
    determining if the processing circuit enters the second operational mode to generate a determining signal.

7. The method of claim 6, wherein the integrated circuit operates in the first operational mode when the integrated circuit is enabled, and operates in the second operational mode when the processing circuit is idle.

8. The method of claim 7, wherein the signal level value is a power level value or a ground voltage level value.

9. The method of claim 6, further comprising: setting the voltage level of the circuit pin according to the determining signal and the signal level value.

10. The method of claim 6, further comprising: generating a pre-output signal when the processing circuit operates in a third operational mode.

11. The method of claim 10, further comprising: selectively outputting the pre-output signal to the circuit pin according to the determining signal or setting the voltage level of the circuit pin as the signal level value.

12. The method of claim 9, further comprising: controlling a clock circuit of the integrated circuit to enter a power down mode.

13. A method for controlling an integrated circuit, comprising:
    detecting a signal level value of a circuit pin when the integrated circuit operates in a first operational mode;

storing the signal level value; and setting a voltage level of the circuit pin according to the signal level value when a processing circuit of the integrated circuit operates in a second operational mode, wherein the integrated circuit operates in the first operational mode when the integrated circuit is enabled, and operates in the second operational mode when the processing circuit is idle.

14. The method of claim 13, wherein the signal level value is a power level value or a ground voltage level value.

15. The method of claim 13, further comprising: determining if the processing circuit enters the second operational mode to generate a determining signal.

16. The method of claim 15, further comprising:

setting the voltage level of the circuit pin according to the determining signal and the signal level value; and controlling a clock circuit of the integrated circuit to enter a power down mode.

17. The method of claim 15, further comprising: generating a pre-output signal when the processing circuit operates in a third operational mode.

18. The method of claim 17, further comprising: selectively outputting the pre-output signal to the circuit pin according to the determining signal or setting the voltage level of the circuit pin as the signal level value.

* * * * *